United States Patent [19]

Allen et al.

[11] 4,347,654

[45] Sep. 7, 1982

[54] METHOD OF FABRICATING A HIGH-FREQUENCY BIPOLAR TRANSISTOR STRUCTURE UTILIZING PERMEATION-ETCHING

[75] Inventors: Bert L. Allen, Cupertino; Robert L. Wourms, Santa Clara; Daniel C. Hu, Saratoga, all of Calif.

[73] Assignee: National Semiconductor Corporation, Santa Clara, Calif.

[21] Appl. No.: 160,513

[22] Filed: Jun. 18, 1980

[51] Int. Cl.³ .................. H01L 21/306; H01L 21/265
[52] U.S. Cl. .................................... 29/576 B; 29/578; 148/1.5; 148/187; 148/188; 156/628; 156/643; 156/646; 156/653; 156/659.1; 357/91
[58] Field of Search ..................... 29/578, 589, 576 B; 148/1.5, 187, 188; 156/628, 643, 646, 653, 657, 659.1; 357/91

[56] References Cited

U.S. PATENT DOCUMENTS

| | | | |
|---|---|---|---|
| 3,489,622 | 1/1970 | Barson et al. | 148/188 X |
| 3,753,807 | 8/1973 | Hoare et al. | 148/188 |
| 3,940,288 | 2/1976 | Takagi et al. | 148/1.5 |
| 3,959,025 | 5/1976 | Polinsky | 148/1.5 |
| 4,149,904 | 4/1979 | Jones | 357/91 X |

OTHER PUBLICATIONS

Bersin et al., "Dryox Process for Etching Silicon Dioxide", Solid State Technology, Apr. 1977, pp. 78-80.
Bersin, R. L., "Survey of Plasma-Etching Processes", Solid State Technology, May, 1976, pp. 31-36.

Primary Examiner—L. Dewayne Rutledge
Assistant Examiner—W. G. Saba
Attorney, Agent, or Firm—Gail W. Woodward; James A. Sheridan; Neil B. Schulte

[57] ABSTRACT

A method of fabricating a high-frequency bipolar transistor structure wherein the emitter, higher impurity concentration base, and lower impurity concentration base regions are defined in a single masking operation. Permeation etching is used to etch regions of an oxide layer under a layer of resist which defines regions of the higher impurity concentration thereby simultaneously defining the emitter and lower impurity concentration base regions. The higher impurity concentration base regions are formed by ion implantation of impurities through the unetched oxide regions. The resist is then removed and the lower impurity concentration base and emitters are formed through the resulting opening in the oxide. This results in the self-aligning of the emitter regions with respect to the base regions.

9 Claims, 11 Drawing Figures

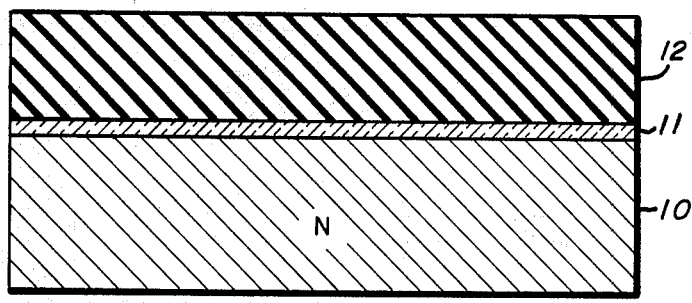
Fig_1
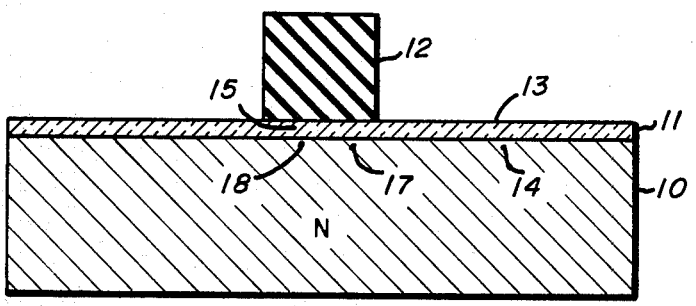
Fig_2
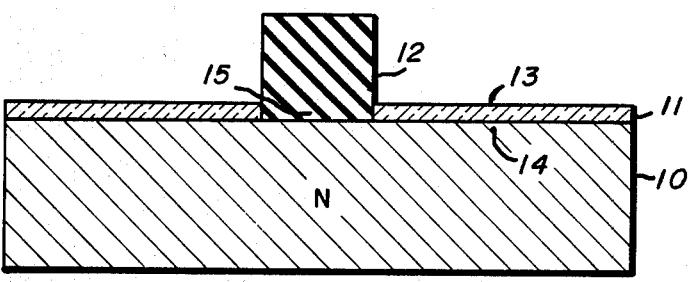
Fig_3
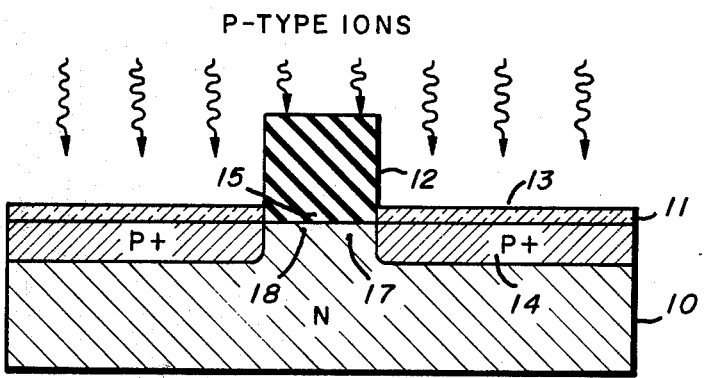
Fig_4
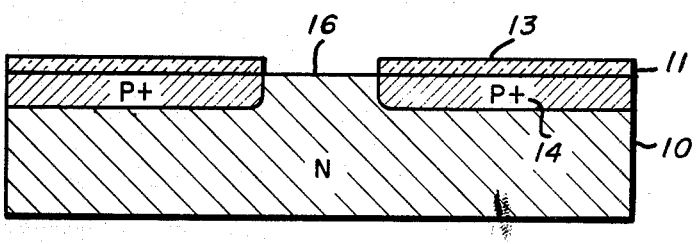
Fig_5

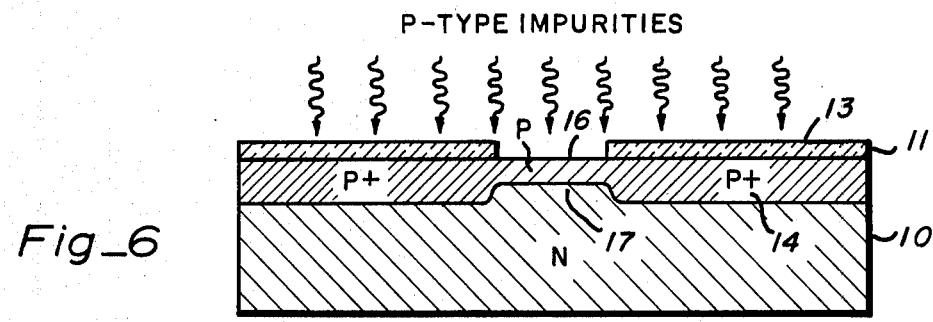
Fig_6
Fig_7
Fig_8
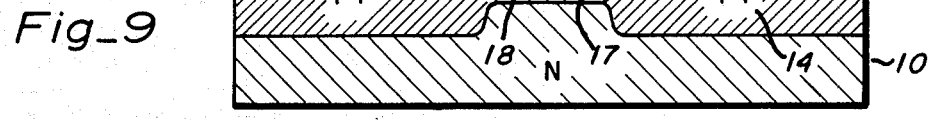
Fig_9
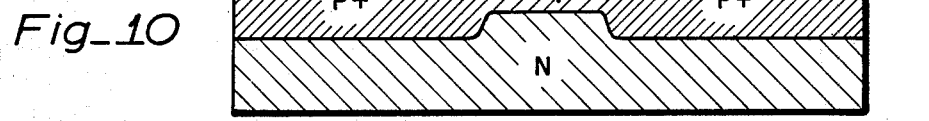
Fig_10
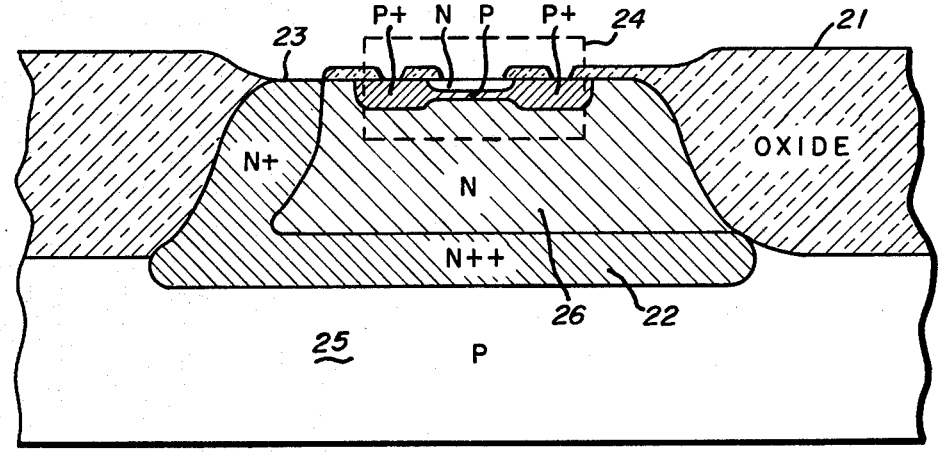
Fig_11

METHOD OF FABRICATING A HIGH-FREQUENCY BIPOLAR TRANSISTOR STRUCTURE UTILIZING PERMEATION-ETCHING

BACKGROUND OF THE INVENTION

This invention relates generally to the fabrication of semiconductor devices; and more particularly to the fabrication of high-frequency bipolar transistor structures. The misalignment of the emitter regions with respect to the higher impurity concentration base regions normally encountered while trying to scale down geometric dimensions of active semiconductor regions is eliminated by the use of a permeation-etching process which allows for the self-aligning of the emitter regions with respect to the base regions. The permeation-etching process is described in:

a. "The Dry-Ox Process for Etching Silicon Dioxide," April 1977, Solid State Technology by Richard L. Bersin and Richard F. Reichelderfer; and in:

b. "IPC Dry Ox Etches: Selective Etching of Silicon Dioxide," Product Bulletin 7409, International Plasma Corporation. Devices having a very small separation between the emitter and higher impurity concentration base regions may be produced resulting in reduced base resistances which allow for high-frequency operation of the devices.

U.S. Pat. No. 3,489,622 issued Jan. 13, 1970 shows a transistor having higher and lower impurity concentration base regions. The higher impurity concentration base regions are formed by using impurities from a doped silicon dioxide layer by heating so as to diffuse the impurities from the doped layer into the semiconductor substrate. Openings in the doped oxide layer are used to define the emitter and lower impurity concentration base regions. In this manner, this technique, also purportedly self-aligning in nature, defines the emitter, lower impurity concentration and higher impurity concentration base regions in a single masking step. Practically, however, this technique, being dependent on diffusion rather than ion implantation, for example, for the transport of impurities into the semiconductor substrate, results in the movement of the impurity atoms in all three dimensions; such movement commencing from the surface of the semiconductor substrate and not from some depth within the substrate. This results in extending the higher concentration base regions into and overlapping with the emitter regions. This, to some extent defeats the self-aligning purpose of this technique. Also, this technique is difficult to control in a production environment.

Another technique of making bipolar structures involves the formation of the higher impurity concentration base regions and the emitter and lower impurity concentration base regions in separate masking operations. This is generally done by first defining and forming the higher impurity concentration base regions using one masking operation and then forming the lower impurity concentration base and emitter regions using a subsequent masking operation. The latter masking operation invariably results in the misalignment of the emitter region with respect to the base regions, and even more so when geometries of these regions are in the order of microns or submicrons, thereby rendering the lower impurity concentration base regions as low resistance regions or resulting in an increased base resistance via the higher impurity concentration base region.

In yet another technique, the higher impurity concentration base regions are first formed uniformly across a semiconductor substrate using ion implantation. Regions are then masked with oxide to allow for the formation of the lower impurity concentration base regions and the emitter regions. These regions are formed at a depth within the substrate greater than the higher impurity concentration base regions. The higher impurity concentration base regions above the emitter regions are appropriately compensated by the introduction of impurities of an opposite kind to those used to form the higher impurity concentration base regions. This technique results in very poor final yields as the ion-implantation step of forming the high impurity concentration base regions damages regions of the substrate wherein the emitter is to be located. Also, the frequency response of devices made using this technique is poor owing to the increased depth location of the lower impurity concentration base regions in relation to the higher impurity concentration base regions. Further, this technique, too, is difficult to control.

SUMMARY OF THE INVENTION

This invention uses a self-aligning technique to define the emitter, lower impurity concentration base and higher impurity concentration base regions surrounding the emitter. The invention uses ion-implantation techniques to form the higher impurity concentration base regions to eliminate the problems of the prior art. This allows the production of semiconductor devices down to the dimensions of lithographic limitations. The emitter is almost perfectly self-aligned with respect to the base regions with there being a minimum or no overlap between the higher concentration base and emitter regions.

This invention incorporates the use of a permeation-etching process. The permeation-etching process etches under a layer of photoresist. Only those regions of an oxide layer are etched that are under the photoresist and regions that are exposed or left uncovered by the resist are left unetched. This reverse etching phenomenon is used to define the emitter, higher impurity concentration base and lower impurity concentration base regions in a single masking operation. A layer of resist is patterned onto a layer of oxide on a semiconductor substrate to define the emitter, lower impurity concentration base and higher impurity concentration base regions. The higher impurity concentration base regions are formed using ion implantation through the oxide with the resist layer acting as a mask. The lower impurity concentration base and emitter regions are formed by first permeation etching the oxide regions under the same resist mask used to define the higher impurity concentration base regions; removing the resist which drops into the openings formed in the underlying oxide layer during the permeation-etching process step; and either implanting of diffusing impurities into the exposed regions of the semiconductor substrate, using the oxide layer as a mask.

The structure so formed is part of a bipolar structure comprising the base, collector and emitter regions. The invention is directed towards the emitter and base junction regions and in particular to a method of fabricating the same in a manner so as to eliminate the misalignment of the emitter regions with respect to the base regions, thereby rendering devices so formed capable of being made very small, which affords high-frequency operation.

BRIEF DESCRIPTION OF THE DRAWINGS

FIGS. 1 through 10 show a cross section of a fragment of a semiconductor wafer region where the emitter and base regions of a bipolar transistor structure are located as it appears after successive processing steps in accordance with the teachings of this invention.

FIG. 11 shows a cross section of a typical bipolar structure region of a semiconductor device wherein this invention may be used.

These drawings are not to scale but are exaggerated vertically to better illustrate the structure.

DETAILED DESCRIPTION

Referring to FIG. 1, a masking layer 11 is formed on a semiconductor substrate 10 of a first conductivity type. The semiconductor substrate is either a silicon wafer which is doped with a first type of impurity or it may be any other layer already disposed on one or more layers of different substrates. In the preferred embodiment, it is an epitaxial layer of silicon grown on a silicon wafer and doped with an opposite conductivity type to that of the silicon wafer. Such processing is well known in the art and is used to form bipolar devices comprising emitter, base and collector regions. This invention relates specifically to the emitter and base junction configurations of a bipolar structure which may have included in it several other regions not depicted or mentioned in this description and are well known in the existing art. Such regions may be, for example, collector or subcollector regions which are used in the formation of NPN or PNP transistors. Another example may be isolation regions used to isolate the device from other devices on the same substrate. Also, not shown or described in this invention disclosure are various means which may be used to form contacts to the emitter and base regions herein depicted as these too are in the existing art and well known. What is described is the invention relating to the formation of the emitter and base junction regions of a bipolar structure which may be used in a discrete device or an integrated circuit.

The insulating layer 11 shown in FIG. 1 is typically a layer of silicon dioxide 3000 Angstroms thick which is thermally grown at 1000° C. The layer itself may conceivably be of some other material which renders itself suitable for the permeation-etching and oxide-masking process described below. Also, it need not be a thermally grown silicon dioxide layer and it may be a layer of silicon dioxide formed by some other means. One such example is chemical vapor deposition which involves the reacting of several different species to combine and form silicon dioxide which is deposited on the substrate.

A second masking layer 12, shown in FIG. 1, is formed on the layer 11. This layer should be of a material that is suitable for the permeation-etching process. It is contemplated that any material which could be a source for providing carbon and hydrogen would work effectively in the permeation-etching process. The presence of oxygen in this layer has been found to ineffectuate the permeation-etching process. Hence, layer 12 may be a layer of polystyrene, polyethylene or any other organic layer comprised of carbon and hydrogen and lacking in oxygen. Negative photoresist, commonly used in the art of fabrication of semiconductors, is also a source for carbon and hydrogen and may be effec-
tively used. The additional advantage of negative resist is its ability to be photolithographed. Other resist materials which could be lithographed with some other source of energy may also be used. Such other sources of energy may be, for example, electron beams or x-ray beams, etc. FIG. 1 shows the thickness of layer 12 to be greater than layer 11. This need not be so. However, it is necessary for layer 12 to be greater in ion absorption than layer 11 if the higher impurity concentration base region which is to be formed by using ion-implantation techniques is to be formed after the permeation-etching process step using layer 12 as a mask. Openings are formed in the masking layer 12, exposing regions 13, shown in FIG. 2, of layer 11 under which are regions 14 of the semiconductor substrate wherein the higher concentration base regions are to be located. The remaining portions of layer 12 lie over regions 15 of layer 11 which are to be etched using the permeation-etching technique. The layer 12 as shown in FIG. 2 defines both regions 14 of the semiconductor substrate, wherein the higher impurity concentration base region is to be located, and regions 18 and 17 in the semiconductor substrate under region 15 of layer 11, wherein the emitter regions and lower impurity concentration base regions respectively are to be located.

Regions 15 of layer 11, shown in FIG. 2, may now be etched using the permeation-etching technique which is known in the prior art. This technique involves, in the present invention, exposure of regions 13 of layer 11 to an ionized gas also known as plasma for a short time. It is contemplated that this step of exposing to a plasma or ionized gas inactivates the surfaces of regions 13, thereby rendering them unetchable in a subsequent etching step wherein the etchant permeates through the unaffected remaining portions of masking layer 12 to etch unactivated regions 15 of layer 11. The ionized gas may be a mixture of gases. In the preferred embodiment, a mixture of carbon tetrafluoride and oxygen is used. The exposure time to the ionized gas is short. A 30 second exposure time, for example, is adequate to inactivate the uncovered regions 13 of layer 11. After the inactivation step, regions 15 of layer 11 are etched or removed. This is done by allowing the etchant to permeate through the remaining portions of layer 12 to come into contact with regions 15 of layer 11 and hence the name permeation etching. In the preferred embodiment wherein layer 11 is comprised of silicon dioxide, anhydrous hydrogen fluoride at a pressure of about 20 torr is used at a temperature of about 175° C. to etch regions 15 of layer 11. Different temperatures and pressures may be used to obtain a desired etch rate. It is contemplated that the etch-reaction products migrate away from the substrate and cause to form a depression or groove in the layer 11, allowing for the movement of the remaining portions of the layer 12 towards the semiconductor substrate. After the etching is completed, the remaining portions of layer 12 fit into the depression so formed as shown in FIG. 3.

It is contemplated that etchants other than hydrogen fluoride may be used so long as they permeate through the masking layer 12 and are suitable to etch the material of layer 11. The higher impurity concentration base regions are formed by ion-implanting impurities through the layer 11 into regions 14 of the semiconductor substrate shown in FIG. 2. These regions may be formed either prior to the permeation-etching step or after the permeation-etching step. In the preferred embodiment, these regions are formed after the permeation-etching step. This requires that layer 12 have greater ion absorptivity than layer 11, thereby allowing for adequate masking during ion implantation of impurities into regions 14, of regions 17 and 18 of the semiconductor substrate wherein the emitter and lower impurity concentration base regions are to be located.

FIG. 4 shows a cross section of the structure after the ion implantation of impurities into regions 14 using layer 12 material to mask regions 17 and 18 of the substrate. In the preferred embodiment, boron is used as the impurity species to form the highly doped or higher impurity concentration base regions. Other impurities could be used depending on whether an NPN or a PNP type of a bipolar structure is desired. Also, within a certain type, there may be used several different impurity species. Examples of such species would be arsenic, phosphorus, and the like. In the preferred embodiment, the substrate is an N-type epitaxial layer of silicon on a P-type silicon wafer. In order to form the higher impurity concentration base regions, a dose of $2.8 \times 10^{14} B^{11}$ ions/cm$^2$ at an energy of 126 Kev may be used. Other dose levels and energy settings could be used depending on the final conductivity desired in the higher impurity concentration base regions, and the oxide layer 11 thickness.

After the formation of the higher impurity concentration base regions and removal of regions 15 of layer 11 by means of permeation etching, layer 12 is removed. In the preferred embodiment wherein the layer 12 material is negative photoresist, this removal is done by conventional means well known in the art, to form the structure depicted in FIG. 5. The higher impurity concentration base regions may be expanded either now or at a future time by means of heating. This step is also well known in the art and referred to as "drive-in." This invention, as already stated, addresses the problem of formation of a self-aligned emitter region with respect to the base regions. However, process steps such as "drive-in," etc. are being referred to in passing notwithstanding that such steps may be easily construed by one ordinarily skilled in the art.

Removal of the remaining portions of the masking layer 12 exposes surface regions 16 of the substrate beneath which the lower impurity base regions and the emitter regions are to be located. The lower impurity concentration base regions are formed by conventional means of introducing impurities into the substrate. Such means could be, for example, diffusion or ion implantation. In both instances, the portions of layer 11 which cover the higher impurity concentration base regions provide a mask to allow the entry of impurities only into the exposed regions of the semiconductor substrate. In the preferred embodiment, the lower impurity concentration base regions are formed by using ion-implantation techniques. Boron may be implanted, for example, through region 16, using oxide layer 11 as a mask at a dose of $1.5 \times 10^{14}$ ions/cm$^2$ of $B^{11}$ at an energy of 25 Kev. The conditions of such an implantation may be varied depending on the characteristics desired. It needs to be stressed that the step of forming the lower impurity concentration base regions may not require that layer 11 act as a mask. The impurities used to form these regions may not affect the high concentration base regions even if they do not enter the substrate through layer 11, owing to the relative differences in concentration between the lower and higher impurity concentration. FIG. 6 shows the cross section of the structure after the formation of the lower impurity concentration base regions 17. In the preferred embodiment, the P-type impurities in regions 14 and 17 are driven-in in a single step. FIG. 7 shows the cross section of the structure after the single drive-in step which is conducted by heating, for example, for 20 minutes at 1000° C. in an inert atmosphere.

It needs to be mentioned that it is conceivable to also combine the two separate implantation steps described above into a single step. This requires that the properties and thickness of layers 11 and 12 be precisely controlled. After obtaining the structure shown in FIG. 3, for example, one may use a dose and energy level set of implantation conditions to directly obtain the structure shown in FIG. 6. In the preferred embodiment, separate implantation steps are used.

Emitter regions 18 are formed by introducing impurities, of a type opposite to that used to form the base regions, into the semiconductor substrate through the same opening 16 in layer 11 used to form the lower impurity concentration base regions. The emitter regions are formed by conventional means. In the preferred embodiment, such regions are formed by diffusion of N-type impurities, phosphorus in this instance. FIG. 8 shows the structure just after exposure to the phosphorus source at a high temperature. An oxide layer 20 results, which is washed or etched away and results finally in the configuration shown in FIG. 9, wherein the emitter 18 depth is less than the lower impurity concentration base region 17 which, in turn, is less than the depth of the higher impurity concentration base regions 14.

Openings 19 in layer 11, shown in FIG. 10, over the higher impurity concentration base regions are made to provide an access for contacts to these regions.

What has been described above is a method to self-align the emitter to the base regions in bipolar transistor structures. This is better shown in FIG. 11 which depicts a typical application wherein this disclosure may be useful. FIG. 11 shows a cross section of a fragment of a semiconductor device comprising a bipolar transistor which is further comprised of a subcollector region 22, a collector region 23, a semiconductor wafer 25 and epitaxial layer 26, the said emitter/base configuration described herein is shown within dotted lines 24, the said transistor being isolated from other active regions of an integrated circuit by oxide regions 21.

Having thus disclosed the invention, it is to be understood that many changes and modifications may be made by one of ordinary skill in the art without departing from the scope of this invention as defined herein.

What is claimed is:

1. A method of fabricating a bipolar structure having emitter, higher impurity concentration base and lower impurity concentration base regions comprising the steps of:

forming a first masking layer of silicon dioxide on the surface of a semiconductor substrate of a first conductivity type;

forming a second masking layer of negative photoresist over said first masking layer;

forming openings in said second masking layer exposing regions of said first masking layer which lie over those regions of said semiconductor substrate where said higher impurity concentration base regions are to be located:

removing said first masking layer material located between the remaining portions of said second masking layer and said semiconductor substrate, using permeation-etching wherein said remaining portions define the area of said removal of said first making layer;

forming said higher impurity concentration base regions by introducing impurities of a second conductivity type through said first masking layer into said semiconductor substrate to a first depth, using said remaining portions of said second masking layer to define the location of said higher impurity concentration base regions;

removing said remaining portions of said second masking layer material thereby exposing areas of said semiconductor substrate;

forming said lower impurity concentration base regions by introducing impurities of said second conductivity type into said exposed areas of said semiconductor substrate to a second depth;

forming said emitter regions by introducing impurities of said first conductivity type into said exposed areas of said semiconductor substrate to a third depth; and providing contacts to said higher impurity concentration base regions and to said emitter regions.

2. The method of claim 1 wherein said semiconductor substrate is an epitaxial layer of doped silicon located on a doped silicon substrate.

3. The method of claim 2 wherein said step of removing said first masking layer material located between said remaining portions of said second masking layer and said semiconductor substrate comprises:

inactivating said exposed regions of said first masking layer by exposing to an ionized gas for a short time prior to removing said first masking layer located between said remaining portions of said second masking layer and said semiconductor substrate by etching with hydrogen fluoride gas permeated through said second masking layer.

4. The method of claim 3 wherein the step of forming said higher impurity concentration base regions comprises implanting impurities of said second conductivity type into said semiconductor substrate through said first masking layer.

5. The method of claim 4 wherein the impurities of said first conductivity type comprises N-type impurities.

6. The method of claim 5 wherein the impurity of said second conductivity type comprises boron.

7. The method of claim 1 wherein said first depth is greater than said second depth and said second depth is greater than said third depth.

8. In a method of fabricating a bipolar transistor structure having emitters formed using a first silicon dioxide mask, lower impurity concentration base and higher impurity concentration base regions on a semiconductor substrate wherein the higher impurity concentration base regions are formed by ion-implantation through a second localized negative photoresist mask such that no implant damage is caused to regions of said semiconductor substrate wherein said emitter is to be located, the improvement comprising:

defining said emitter, said lower impurity concentration base and said higher impurity concentration base regions in a single masking operation in which said first mask is created from said second mask using permeation-etching to etch said first mask in those areas covered by said second mask, thereby forming a self-aligned transistor structure.

9. The method of claim 8 wherein said higher impurity concentration base regions are formed by ion-implantation.

* * * * *